(12) United States Patent
Pelz et al.

(10) Patent No.: US 11,958,068 B2
(45) Date of Patent: Apr. 16, 2024

(54) METHOD FOR MANUFACTURING AN ELECTRICALLY OPERABLE HEATING BODY FOR AN INHALER

(71) Applicant: KÖRBER TECHNOLOGIES GMBH, Hamburg (DE)

(72) Inventors: Uwe Pelz, Schallstadt (DE); Muhannad Ghanam, Freiburg (DE); Jan Jaklin, Fellbach (DE); Peter Woias, Freiburg (DE); Sonali Rath, Heilsbronn (DE); Frank Goldschmidtboeing, Ortenberg (DE)

(73) Assignee: KÖRBER TECHNOLOGIES GMBH, Hamburg (DE)

( * ) Notice: Subject to any disclaimer, the term of this patent is extended or adjusted under 35 U.S.C. 154(b) by 866 days.

(21) Appl. No.: 16/978,516

(22) PCT Filed: Feb. 15, 2019

(86) PCT No.: PCT/EP2019/053813
§ 371 (c)(1),
(2) Date: Sep. 4, 2020

(87) PCT Pub. No.: WO2019/170394
PCT Pub. Date: Sep. 12, 2019

(65) Prior Publication Data
US 2020/0397052 A1 Dec. 24, 2020

(30) Foreign Application Priority Data
Mar. 7, 2018 (DE) .................. 102018105220.0

(51) Int. Cl.
*B05B 7/16* (2006.01)
*A24F 40/46* (2020.01)
(Continued)

(52) U.S. Cl.
CPC ............ *B05B 7/1686* (2013.01); *A24F 40/46* (2020.01); *A24F 40/70* (2020.01); *B05B 7/0884* (2013.01);
(Continued)

(58) Field of Classification Search
CPC .......... A24F 40/46; A24F 40/70; A24F 40/10; B05B 7/1686; B05B 7/0884;
(Continued)

(56) References Cited

U.S. PATENT DOCUMENTS

| 3 A | * | 8/1836 | Blanchard ............... G01B 7/107 |
| | | | 190/18 R |
| 3,811,934 A | * | 5/1974 | Glaser .................... H05B 3/265 |
| | | | 427/124 |

(Continued)

FOREIGN PATENT DOCUMENTS

| CA | 3013331 A1 | 10/2017 |
| DE | 102004051364 A1 | 6/2005 |

(Continued)

OTHER PUBLICATIONS

Examination Report issued by the CNIPA dated Oct. 25, 2021 for parallel Chinese Patent Application No. 201980017409.5.
(Continued)

*Primary Examiner* — Alexander Gilman
(74) *Attorney, Agent, or Firm* — SALIWANCHIK, LLOYD & EISENSCHENK

(57) ABSTRACT

Method for manufacturing an electrically operable heating body for an inhaler, wherein a semiconductor material is provided so as to be substantially planar, and a plurality of channels are incorporated into the semiconductor material substantially in the direction of the surface normal of the planar semiconductor material, such that a fluid can pass through the semiconductor material in the channels.

14 Claims, 7 Drawing Sheets

(51) Int. Cl.
  *A24F 40/70* (2020.01)
  *B05B 7/08* (2006.01)
  *H01L 23/34* (2006.01)
  *H05B 3/14* (2006.01)
  *A24F 40/10* (2020.01)

(52) U.S. Cl.
  CPC ........... *H01L 23/345* (2013.01); *H05B 3/143* (2013.01); *A24F 40/10* (2020.01); *H05B 2203/017* (2013.01)

(58) Field of Classification Search
  CPC . H01L 23/345; H05B 3/143; H05B 2203/017; H05B 2203/024; H05B 3/265
  USPC ......................................................... 131/329
  See application file for complete search history.

(56) References Cited

U.S. PATENT DOCUMENTS

| | | | |
|---|---|---|---|
| 6,054,692 A * | 4/2000 | Hitomi | H05B 3/50 219/544 |
| 6,914,220 B2 | 7/2005 | Tian et al. | |
| 7,797,863 B2 * | 9/2010 | Moreno Jordana | D06F 75/38 38/93 |
| 11,653,419 B2 * | 5/2023 | Silvestrini | A24F 40/50 131/329 |
| 11,696,368 B2 * | 7/2023 | Silvestrini | H05B 1/0227 131/329 |
| 2002/0084510 A1 | 7/2002 | Jun et al. | |
| 2004/0056020 A1 * | 3/2004 | Helmreich | A61B 6/0442 219/528 |
| 2005/0109768 A1 | 5/2005 | Aoki et al. | |
| 2006/0219176 A1 * | 10/2006 | Tomita | H05B 3/143 118/725 |
| 2006/0289448 A1 * | 12/2006 | Natsuhara | H05B 3/143 118/724 |
| 2007/0221649 A1 * | 9/2007 | Ohta | H05B 3/143 219/385 |
| 2008/0110874 A1 * | 5/2008 | Hayashi | H01L 21/67103 219/468.1 |
| 2008/0142501 A1 * | 6/2008 | Morioka | H05B 3/12 219/444.1 |
| 2009/0057296 A1 * | 3/2009 | Niemz | H05B 3/342 219/544 |
| 2009/0095311 A1 * | 4/2009 | Han | H05B 3/06 131/194 |
| 2011/0074380 A1 * | 3/2011 | Jeon | H05B 3/56 174/250 |
| 2011/0290784 A1 * | 12/2011 | Orawetz | H05B 3/36 219/486 |
| 2014/0041589 A1 * | 2/2014 | Martinz | B22F 5/006 118/724 |
| 2014/0060554 A1 * | 3/2014 | Collett | A24F 40/46 392/386 |
| 2015/0114409 A1 * | 4/2015 | Brammer | F24H 1/0018 392/394 |
| 2015/0123016 A1 * | 5/2015 | Nagatani | H05B 3/265 250/493.1 |
| 2015/0180443 A1 * | 6/2015 | Hayashi | H03H 9/0547 219/541 |
| 2016/0007653 A1 | 1/2016 | Tu | |
| 2016/0138795 A1 * | 5/2016 | Meinhart | G06F 17/18 392/395 |
| 2016/0345630 A1 * | 12/2016 | Mironov | H05B 3/34 |
| 2017/0108210 A1 | 4/2017 | Meinhart et al. | |
| 2017/0280776 A1 | 10/2017 | Manca et al. | |
| 2020/0205478 A1 | 7/2020 | Dick et al. | |

FOREIGN PATENT DOCUMENTS

| | | |
|---|---|---|
| DE | 102016002665 A1 | 9/2017 |
| JP | H8-55672 A | 2/1996 |
| JP | 2015-532828 A | 11/2015 |
| JP | 2017-506509 A | 3/2017 |
| JP | 2017-538399 A | 12/2017 |
| WO | WO 2013/168332 A1 | 11/2013 |
| WO | WO 2014/037794 A2 | 3/2014 |
| WO | WO 2016/145072 A1 | 9/2016 |
| WO | WO 2017/182249 A1 | 10/2017 |
| WO | WO 2017/207419 A1 | 12/2017 |
| WO | WO 2017/207443 A1 | 12/2017 |
| WO | WO 2017/220274 A1 | 12/2017 |
| WO | WO 2018/083007 A1 | 5/2018 |

OTHER PUBLICATIONS

Examination Report issued by the European Patent Office dated Aug. 24, 2022 for parallel European Patent Application No. 19 706 488.4.

First Examination Report issued by the German Patent and Trademark Office dated Oct. 19, 2018 with respect to the German priority application No. 10 2018 105 220.0.

Examination Report issued in the Japanese Patent Office dated Mar. 9, 2023 with respect to parallel Japanese patent application No. 2020-546476.

* cited by examiner

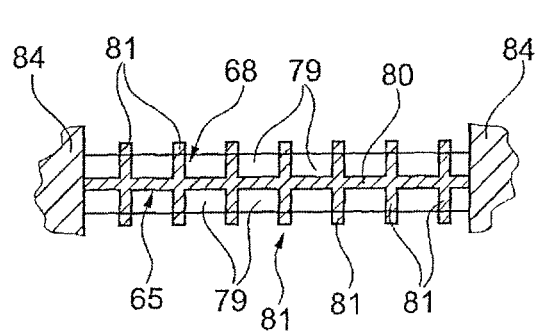
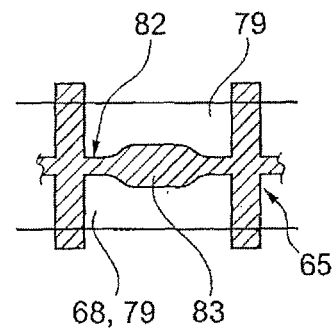
Fig. 7      Fig. 8
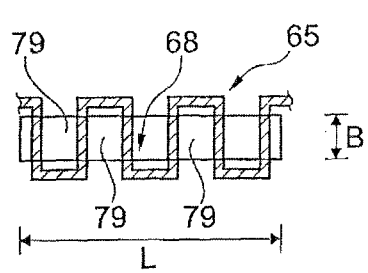
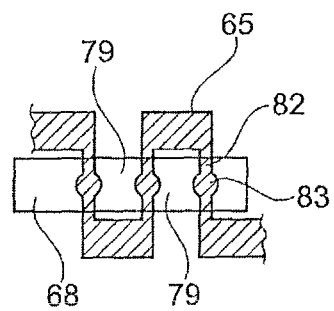
Fig. 9      Fig. 10
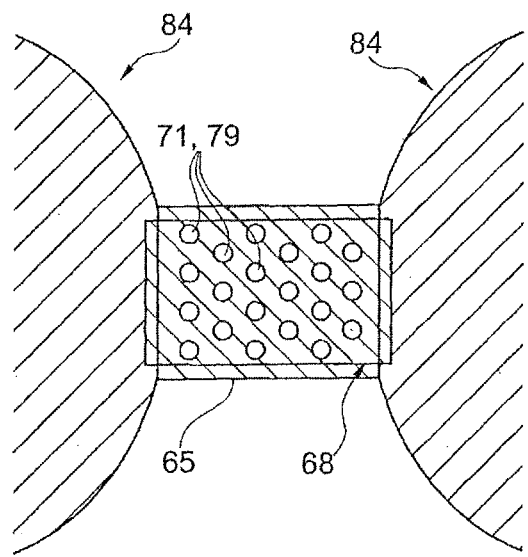
Fig. 11

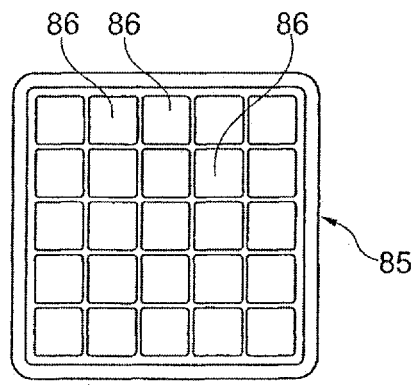
Fig. 12
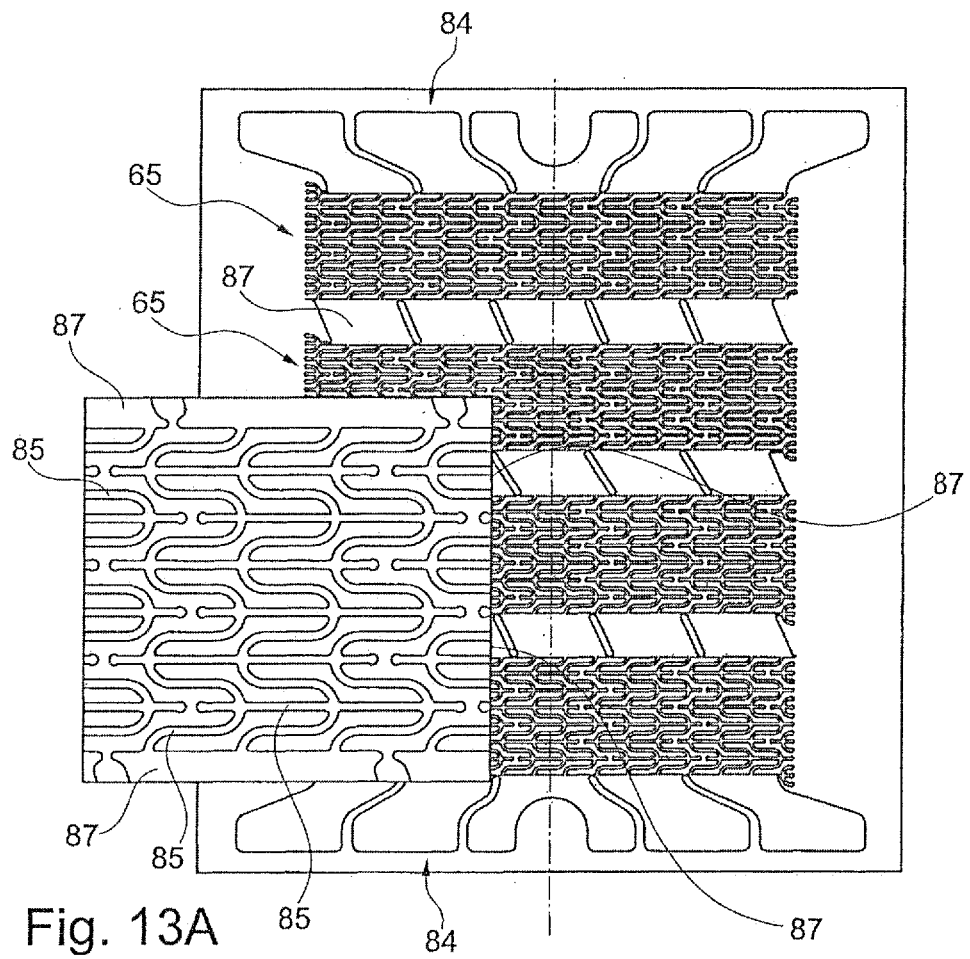
Fig. 13A
Fig. 13

METHOD FOR MANUFACTURING AN ELECTRICALLY OPERABLE HEATING BODY FOR AN INHALER

CROSS REFERENCE TO RELATED APPLICATIONS

This application is a National Stage Application of International Application Number PCT/EP2019/053813, filed Feb. 15, 2019; which claims priority to German Patent Application No. 10 2018 105 220.0, filed Mar. 7, 2018.

FIELD OF INVENTION

The present invention relates to a method for manufacturing an electrically operable, in particular planar heating body for an inhaler, in particular for an electronic cigarette product, preferably for evaporating liquid.

Furthermore, the invention relates to a heating body manufactured according to the aforementioned method and to a wafer comprising such heating bodies.

BACKGROUND OF THE INVENTION

In WO 2014/037794 A2, providing a heating body for an electronic cigarette product as a micro-electromechanical system (MEMS) is disclosed. Silicon, inter alia, is mentioned as a suitable material for this purpose.

US 2016/0007653 A1 also discloses a MEMS heating body for an electronic cigarette product.

DE 10 2016 002 665 A1 likewise mentions a MEMS heating body for an electronic cigarette product.

U.S. Pat. No. 6,914,220 B2 discloses the manufacture of a heating body made of silicon, but for a gas chromatograph.

Significant problems which can occur in the case of simple metal filament heaters, but also, in principle, in the case of MEMS heaters, when evaporating liquid are: what is referred to as "dry puff", in which the heating body heats up when dry, i.e. without a sufficient quantity of liquid, which can lead to damage to the heating body, but in particular also to the escape of harmful components from the heating body material; saturated boiling, which can lead to local overheating and uneven heating of a liquid, which can lead, inter alia, to an explosive spraying of liquid; heating of metal components or alloys of the heating body with or without contact with a liquid, which can cause a harmful release of metal components, metal atoms or metal ions, and/or a harmful, catalytic effect; and insufficiently precise electrical control of the heating body, which can thermodynamically lead to a separating and/or an otherwise undesirable evaporation behaviour of different liquid components, in particular of those liquid components which have different boiling temperatures.

BRIEF SUMMARY OF THE INVENTION

The problem addressed by the invention is that of providing a method for manufacturing a heating body, by means of which a heating body is produced in a simple, inexpensive and reproducible manner, which heating body also allows and ensures a uniform, easily electrically controllable, monitored and reliable heating of a substrate, in particular of a liquid in an inhaler, in particular an electronic cigarette product.

The invention solves said problem by means of the features of the independent claims.

In a solution to the problem according to the invention, the method of the type mentioned at the outset is characterised in that a preferably metal-free semiconductor material is provided so as to be substantially planar, and a plurality of channels are incorporated into the semiconductor material substantially in the direction of the surface normal of the planar semiconductor material, such that a fluid can pass through the semiconductor material in the channels.

By means of the heating-body manufacture according to the invention, if metal components (at least "bare" metal components of the heating body that can come into direct contact with a liquid) are avoided, it is possible to particularly advantageously avoid a potential harmful release of metal components, metal atoms or metal ions, and/or to avoid a potential harmful catalytic effect, which release and catalytic effect contaminate the vapour or aerosol to be generated, which aerosol is intended for inhalation, in a way which is harmful to health.

At the same time, the heating body made from a semiconductor material and produced according to the invention can be electrically controlled just as reliably, uniformly and precisely as a metal heating body, in particular with regard to temperature control.

According to a particularly advantageous aspect, the heating body can consist of or be made from a material which, at least in an operating range, for example between 100° C. and 240° C., has a negative temperature coefficient (NTC), i.e. the electrical resistance of the heating body decreases as the temperature increases.

By using a material which has a negative temperature coefficient of the resistivity in the range of the desired temperature or in the operating range of an evaporator unit, the formation of hot spots or overheating can be suppressed, and a more homogeneous temperature distribution can be achieved. A heating body which has a negative temperature coefficient can be produced on a semiconductor substrate in a micromechanically simple manner. As a result of this feature, poorly cooled regions exhibit a lower resistance and therefore a reduced heat output. The reduced cooling is therefore counteracted.

This can be demonstrated using a simplified example. The heating body together with its plurality of channels consists, for example, of n portions connected in series that have nominally equal resistances $R0$ at the desired temperature $T0$. One region, for example region 1, experiences a temperature increase of $DT$ due to a reduced level of heat removal. The resistance of this region thus becomes $R1=R0(1+a*DT)$, where a denotes the temperature coefficient of the electrical resistance.

In embodiments in which an electrical unit supplies voltage with the voltage $U0$, the voltage $U1=U0*R1/(R1+(n-1)*R0)$ drops across this resistance, while the voltage $U2=U0*R0/(R1+(n-1)*R0)$ drops across each of the other resistances. The current through the resistances results in $I1=U0/(R1+(n-1)*R0)$. Accordingly, a resulting heat output for the first portion is $P1=U1*I1=U0^2*R1/(R1+(n-1)*R0)^2$ and for the remaining portions is $P2=U2*I1=U0^2*R0/(R1+(n-1)*R0)^2$. Linearisation of this formula is permissible for low temperatures and leads to $P1=U0^2/(n^2 R0)*(1+a*DT)$ and $P2=U0^2/(n^2 R0)*(1-2a/n*DT)$. The nominal heat output is $P0=U0^2/(n^2 R0)$. If a material which has the negative temperature coefficient $a<0$ is used, the heat output is reduced in region 1 and increased slightly in the other regions. Overall, the temperature is thus homogenised.

Other embodiments in which the electrical unit supplies current with the current $I0$ produce similar results. The voltage U1=I0*R1 drops across the region 1 and U2=I0*R0 drops in each of the other regions. The local heat output is therefore P1=I0^2*R0*(1+a*DT) and P2=I0^2*R0. In this case, the use of a material which has the negative temperature coefficient a<0 therefore also leads to a reduction in the heat output in region 1 and to an unchanged heat output in the other regions, which also results in homogenisation of the temperature distribution. Depending on the control concept, both the voltage supply and current supply can therefore be used advantageously.

Polycrystalline semiconductor materials, for example polysilicon or polysilicon carbide, are preferably suitable as materials for the heating body which have a negative temperature coefficient of resistance. Under certain circumstances, single-crystalline semiconductor material which has a sufficiently high activation energy of the doping levels can also have a negative temperature coefficient of resistance.

The heating body can advantageously consist of a doped semiconductor. Doped semiconductors have a temperature dependence of conductivity that is proportional to $T^{(-3/2)} \cdot \exp(-E_a/2kT)$, where $E_a$ denotes the acceptor level and k is the Boltzmann constant. In silicon, for example, indium forms an acceptor level of $E_a=160$ meV, and thallium forms an acceptor level of $E_a=246$ meV. As preferred materials of the heating body, indium-doped silicon or thallium-doped silicon therefore has a negative temperature coefficient in the operating range of the evaporator unit up to and above 300° C. Similarly favorable materials are aluminium-doped silicon carbide (SiC) with $E_a=190$ meV or boron-doped silicon carbide with $E_a=285$ meV.

NTC materials generally have a higher temperature coefficient than metals and it is therefore possible to determine the temperature far more precisely by measuring the resistance of the heating body. The heating body is preferably designed as an electric resistance heater.

As already indicated above, according to the invention, a silicon is preferably substantially used as the semiconductor material, preferably a polysilicon, the electrical conductivity of the semiconductor material preferably being improved at least in regions by doping. Furthermore, according to the invention, the semiconductor material can preferably be n-doped, preferably using phosphorus, and p-doping, for example using boron, can also be considered.

In a development of the method according to the invention, at least in regions, at least one coating is applied to the semiconductor material on at least one face of the semiconductor material.

Said coating can be, for example, a layer of silicon oxide and/or silicon nitride, which is applied to or grown on a silicon base.

In addition, a photoelectric layer, in particular a photoresist, can be applied, which is structured by means of exposure (lithography) using a mask. By means of the exposed photoresist, the exposed regions of which are removed in a manner which is suitable and known per se, an etching mask for structuring the semiconductor material by means of suitable etching is preferably achieved.

According to the invention, one coating is preferably metal. This could also occur so as to form heating elements or heating surfaces, in particular also, for example, annularly in portions of the channels or in the walls of the channels, "annularly" not being intended to limit the cross-sectional area of the channels to a circular shape, it being possible instead to understand said term in the general sense of a circumferential shape. Metal contact surfaces in contact with a liquid to be evaporated can preferably be avoided by covering the metal surfaces with a passive or passivated layer, for example with a glass-like material. A non-metal and temperature-stable material could in particular be used, for example silicon dioxide, silicon nitride or quartz glass.

In particular, however, the semiconductor material is preferably provided with electrical contacts, preferably using a metal coating which can then, if desired, be reduced to contact surfaces.

The semiconductor material can be oxidised at least in regions; in particular, providing intermediate or separating layers made of a semiconductor oxide can also be considered.

In the method according to the invention, a flow control layer can be provided as a layer or coating, which flow control layer has through-holes extending through the flow control layer that communicate with the channels. The contact angle between the liquid and the inner wall of one or each through-hole can particularly advantageously be changed by applying an electrical voltage which can be generated by means of a voltage source or an electrical field generated by the electrical voltage. As a result, the flow through the through-holes can advantageously be changed, in particular stopped and/or released, in particular by reducing or switching off the electrical voltage. In this way, a portion of liquid in the microchannels can be conveyed and measured exactly, and backflow protection and complete, precisely portioned evaporation can be realised. The effect of electrowetting is preferably used in this case.

An insulating layer having through-openings extending through the insulating layer is advantageously provided between the flow control layer and the substrate. As a result, undesired evaporation of liquid in the liquid store or in the flow control layer and the flow holes in said flow control layer during the evaporation can be effectively prevented. Undesired heat transfer into the liquid store is also prevented. In other words, the heat input into the substrate can be optimised, and undesired heating or even evaporation of liquid-containing portions which are upstream in the substrate can be reliably prevented.

In another development of the method according to the invention, the channels are formed in the semiconductor material by, preferably dry, etching. According to the invention, reactive ion etching (RIE=reactive ion etching, in particular DRIE=dry reactive ion etching) is preferably substantially used for this purpose. For the manufacturing process, according to the invention, of a heating body having channels, anisotropic etching is preferred, in which etching into the semiconductor material is carried out substantially perpendicularly to the surface.

As is also described below, wet chemical etching can also alternatively be used according to the invention. In this case, an orientation is preferably carried out in crystal directions. For example, in this case, channels could also be produced that do not appear rectangular in the longitudinal section thereof, but instead appear trapezoidal.

In particular, it is also possible to etch channels differently from the outlet side thereof than from the inlet side, the tunneling from both sides ultimately forming a completely continuous channel. For example, channels could be dry etched from the outlet side and wet etched from the outlet side.

In the RIE, the semiconductor material, i.e. preferably a wafer, is substantially placed in a process chamber, specifically on an electrode operated using AC voltage, in particular a high-frequency electrode. In a gas which is additionally introduced into the process chamber, a plasma is generated by impact ionisation, which plasma contains free electrodes and charged ions. The electrodes can be charged with positive voltage half-waves, as a result of which the negatively charged, light electrons accumulate at the positive electrode which is thereby charged with a high negative bias, since the electrons can no longer leave the electrode due to the work function necessary for this purpose. Positively charged ions, which are heavier and cannot follow the high-frequency half-waves, then move towards the electrode which is negatively charged in this manner, with which electrode the semiconductor material is associated. As a result, the ions etch the semiconductor material by removing semiconductor material, which is referred to as physical etching. Chemical etching can also occur, in which free radicals react with material. The free path length of the ions can be set by the gas pressure, a longer distance leading to anisotropic etching, since the ions can move over a longer distance in a direction perpendicular to the semiconductor surface. The process gas pressure can be, for example, between 1 and 100 Pa, a gas pressure of approximately 4 to 8 Pa, preferably approximately 6 Pa, for example, being preferably provided for anisotropic etching.

A further development of the method according to the invention is characterised in that the channels are fluidically accessible from both sides of the semiconductor material. Etching through the entire thickness of the semiconductor material could also occur from only one surface. However, the channels could in particular also be etched from surfaces opposite one another, and this can occur, for example, with different cross-sectional sizes or diameters from the two sides, so that the relevant channel has different diameters in the course thereof, for example diameters which are stepped or conical in portions. This can promote the directed liquid flow and/or the portioning thereof.

The channels are preferably so thin that capillary forces occur in the liquid to be used, in order to convey the liquid through the channels. The channels are preferably microchannels and the manufacture, according to the invention, is preferably that of a micro-electromechanical system (MEMS).

Accordingly, the heating body is preferably designed such that liquid can be refilled in the channels due to capillary forces. In a method according to the invention, for the cyclical operation of an evaporator unit, liquid is first evaporated from a stable equilibrium state. In a subsequent refill phase, liquid flows in by means of capillary forces in order to replace the evaporated liquid, until the initial state is achieved again. The control of a time curve of the heating voltage can be adapted to this cyclical operation. For example, the heating voltage can be pulsed such that no heating voltage is applied to the heating element in the refilling phase, in order to prevent overheating of the heating element in the refilling phase.

With regard to the goal of a temperature distribution that is as homogeneous as possible, the heating body is advantageously to be designed such that a higher heat output is introduced for the purpose of compensation in regions which have a higher level of heat removal. This can be achieved, for example, by means of tapered and/or widened portions which are introduced into the heating body in a targeted manner.

The frequency and/or duty cycle of a heating voltage Uh for the heating body are preferably to be adapted to the natural oscillation and/or natural frequency of oscillations of gas bubbles formed in the microchannels. This is based on the knowledge that evaporation using a passive capillary liquid supply, for example by means of a wick structure, is subject to different laws than evaporation using an active, for example portioned or pumped, supply of the liquid. In order to optimise the evaporation in the sense of a uniform vapour generation which is free of harmful substances and depends, inter alia, on the conveying rate of the liquid to the heating body, the heating voltage for the heating body is advantageously pulsed in such a way that the conveying rate is adapted to the natural oscillation of the bubble formation during the saturated boiling in the microchannels.

Such a preparation of the heating body can or must already be partly taken into account in the manufacturing process of said heating body, by a specific design of a heating body being predetermined as a manufacturing goal.

It has been shown that a preferred heating frequency in the range between 20 Hz and 200 Hz, more preferably in the range between 25 Hz and 100 Hz, even more preferably in the range between 30 Hz and 70 Hz and, for example, 50 Hz, covers a large proportion of the suitable liquids and liquid mixtures.

The maximum heating current generated by the heating voltage Uh for the heating body is also preferably no more than 7 A, in order to ensure concentrated vapour while preventing overheating.

According to the invention, the heating body is provided with a plurality of microchannels which fluidically connect an inlet side of the heating body to an outlet side. The inlet side can preferably be fluidically connected to a liquid store via a wick structure. A wick structure, which can also be attached to the heating body, moulded onto the heating body or connected to the heating body in another suitable manner during the manufacture of said heating body, can be used to passively convey liquid from a liquid store to the heating body by means of capillary forces.

In this case, any capillary-suitable form of a porous structure, for example porous pads or non-woven materials, can be understood to be and be used as a "wick" or a "wick structure". An accretion or growth of porous nanostructures, in particular directly on an inlet side of the heating body, is also conceivable.

The average diameter of the microchannels is preferably in the range between 5 μm and 200 μm, more preferably in the range between 30 μm and 150 μm, even more preferably in the range between 50 μm and 100 μm. Due to these dimensions, a capillary action is advantageously produced, so that liquid penetrating a microchannel until at the inlet side of the heating body rises upwards through the microchannel until the microchannel is filled with liquid. The volume ratio of the microchannels to the heating body, which can be referred to as the porosity of the heating body, is for example in the range between 10% and 50%, advantageously in the range between 15% and 40%, more advantageously in the range between 20% and 30%, and is, for example, 25%. The lengths of the edges of the surfaces of the heating body that are provided with microchannels are, for example, in the range between 0.5 mm and 3 mm. For example, the dimensions of the surfaces of the heating body that are provided with microchannels can be as follows: 0.95 mm×1.75 mm or 1.9 mm×1.75 mm or 1.9 mm×0.75 mm. The lengths of the edges of the heating body can be, for example, in the range between 0.5 mm and 5 mm, preferably in the range between 0.75 mm and 4 mm, more preferably in the range between 1 mm and 3 mm. The surface of the heating body (chip size) can be, for example, 1 mm×3 mm or 2 mm×3 mm or 1 mm×2 mm. The width of the heating body is preferably in the range between 1 mm and 5 mm, more preferably in the range between 2 mm and 4 mm, and is, for example, 3 mm. The height of the heating body is preferably in the range between 0.05 mm and 1 mm, more preferably in the range between 0.1 mm and 0.75 mm, even more preferably in the range between 0.2 mm and 0.5 mm, and is, for example, 0.3 mm.

The number of microchannels is preferably in the range between 4 and 1000. This allows the heat input from the substrate into the microchannels to be optimised and ensures a high evaporation capacity and a sufficiently large vapour outlet surface.

The microchannels can be arranged in the form of a square, rectangular, polygonal, round, oval or differently shaped array. The array can be in the form of a matrix having s columns and z rows, s advantageously being in the range between 2 and 50 and more advantageously in the range between 3 and 30, and/or z advantageously being in the range between 2 and 50 and more advantageously in the range between 3 and 30. This allows for an effective arrangement of microchannels having a guaranteed high evaporation capacity, which is simple to produce.

The cross section of the microchannels can be square, rectangular, polygonal, round, oval or otherwise shaped and/or can vary in the longitudinal direction in portions, in particular can increase, decrease or remain constant.

The length of one or each microchannel is preferably in the range between 100 µm and 1000 µm, more preferably in the range between 150 µm and 750 µm, even more preferably in the range between 180 µm and 400 µm, and is, for example, 300 µm. This allows for an optimum liquid absorption and portion formation in the case of sufficient heat input from the heating body into the microchannels.

The distance between two microchannels is preferably at least 1.3 times the inner diameter of a microchannel, the distance being in relation to the central axes of two adjacent microchannels. The distance can preferably be 1.5 to 5 times, more preferably 2 to 4 times, the inner diameter of a microchannel. This allows for an optimum heat input from the substrate into the microchannels, and a sufficiently stable arrangement and wall thickness of the microchannels.

Due to the features described above, the heating body can also be referred to as a volume heater.

As previously indicated multiple times, in the method according to the invention, a plurality of heating elements are preferably formed on a wafer, and individual heating bodies or groups of heating bodies are preferably then removed from the wafer, preferably as what are referred to as dies.

In this case, each heating body preferably has the thickness of a wafer, which at the same time corresponds to the length of the continuous channels thereof. As is known, the diameters of a wafer can preferably be approximately in a range from approximately 100 mm to approximately 450 mm, inclusive, with a tendency towards even larger wafers. The larger the wafer, the more heating bodies can be formed using said wafer, and the smaller the unit price is of a heating body, which is a relevant economic variable, as a heating body or a group of heating bodies is preferably to be provided in a closed tank system in a cartridge which is disposed of after consumption of the substance. The materials used according to the invention for the heating body thus also have the advantage that they can be disposed of in an environmentally friendly manner and, optionally, can also be recycled.

The heating body can advantageously be produced from portions of a wafer using thin-film layer technology, which wafer has a layer thickness of preferably less than or equal to 1000 µm, more preferably less than or equal to 750 µm, even more preferably less than or equal to 500 µm. Surfaces of the heating body can advantageously be hydrophilic. The outlet side of the heating body can advantageously be microstructured or have microgrooves.

The wafer can be divided ("diced" by "dicing") into substantially finished heating body regions in such a way that regions ("dies") of the wafer have one or more heating bodies.

Dicing of this kind can usually be carried out by sawing, scoring and breaking or by laser cutting. In particular, this can be carried out in a precise, machine-controlled manner. In a DGB process ("dice before grind"), the wafer is cut to half the depth thereof along the die boundaries, and is then held, on the cut face thereof, on a holding tape, while the uncut rear face of the wafer is ground and thinned to the target material thickness.

In what is referred to as "stealth" dicing, the boundaries of a die are first weakened with a laser and then broken. An Nd:YAG laser, which is preferably operated in a pulsed manner, can in particular be used as the laser. Maximum absorption of the laser energy by means of focusing the laser beam can be achieved by operating the laser at a wavelength of 1064 nm in order to adapt said wavelength as well as possible to the electronic band gap of silicon in the range of size 1.11 eV or 1117 nm. The pulsation of the laser can be approximately 100 kHz, for example, and the wafer can be moved, for example, at a speed of 1 m/s in order to achieve a line of weakness along the boundary of the die, which line optionally can also be traveled multiple times. Small volume regions of silicon, of a few $\mu m^3$, can be heated to approximately 1000 K within nanoseconds.

Dry dicing, in particular the stealth dicing described above, is particularly advantageous, if not essential, for the separation of MEMS structures. In particular, it is also advantageous for providing, according to the invention, a heating body which is in principle perforated, since the semiconductor material, which can be brittle anyway, is weakened to some extent by the channels (or holes) introduced into the heating body. Careful and controlled dicing is therefore recommended.

At this point, it should be mentioned that the channels could be lasered into the semiconductor material, such that etching is largely or completely avoided. Alternatively, the channels could also be drilled or punched into the semiconductor material in another suitable manner or mechanically formed in another manner.

In a further development of the method according to the invention, the heating body or the heating bodies is/are further substantially used as a bare chip. For example, individual heating bodies or groups of heating bodies can also be enclosed in some way, for example edged, in order to be integrated in a closed tank system in a leak-free manner, but the heating body, as such, as a chip preferably remains functionally naked for the evaporator function.

Independent protection is also claimed for a heating body manufactured according to the invention.

Independent protection, in particular as a semi-finished product, is also claimed for a wafer made of a semiconductor material, which wafer, according to the invention, has a plurality of heating bodies or elements or regions suitable as heating bodies.

The invention will be explained below on the basis of preferred embodiments with reference to the accompanying drawings, in which

BRIEF DESCRIPTION OF THE FIGURES

FIGS. 7 to 11 show different embodiments of heating elements in plan views from above onto the outlet side of a heating body;

FIG. 12 is a schematic cross-sectional view of a microfibril for a bionic structure;

FIG. 13 shows a bionic heating structure constructed from microfibrils according to FIG. 12;

FIG. 13A is an enlarged, detail view of FIG. 13 in the region of a heating element;

DETAILED DESCRIPTION

Figure 1:
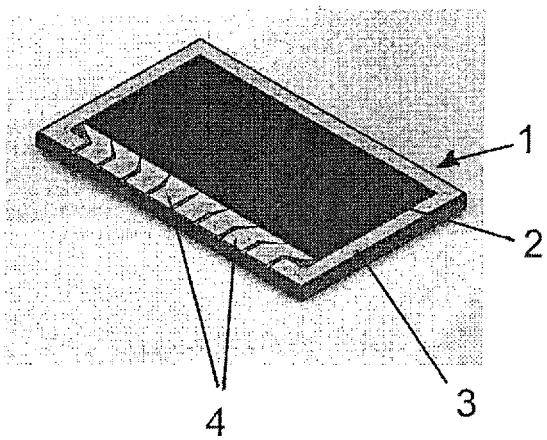
FIG. 1 is a perspective view of an embodiment of a heating body produced using the method according to the invention.

FIG. 1 is a perspective view of an embodiment of a heating body produced using the method according to the invention. Shown is a surface of the heating body 1, from which surface metal contacts and microchannels of the heating body 1 are accessible, while the other surface of the heating body 1 cannot be seen. The selected outlet side of the microchannels of the heating body 1 can be substantially exposed in an inhaler.

The heating body 1 is in the form of a semiconductor chip which, in the central region thereof, has an array 2 having a plurality of microchannels by which the heating body is perforated so as to be permeable to liquid. The diameters of the microchannels are so small that said microchannels are not discernible with sufficient resolution in the illustration in FIG. 1. Electrical contacts 4 which have been formed from a structured metal layer can be seen in the edge region 3 of the heating body 1. These contacts 4 could, for example, be plugged, as a plug connector, into a connector holder in another electrical device, in particular a control device of an inhaler, for the purpose of electrical connection to said device.

FIGS. 2 to 6 show different, at least partly optional phases of a manufacturing process for a heating body 1 according to FIG. 1. FIGS. 2 to 6 each show, in principle, sections through a portion of a wafer made of a semiconductor material, preferably made of silicon, which sections show the structure of layers of the wafer in each of the different phases.

Figure 2:
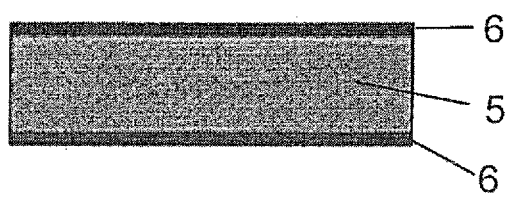
FIGS. 2 to 6 show different, at least partially optional phases of a manufacturing process for a heating body according to FIG. 1.

FIG. 2 first shows the basic semiconductor material 5. In the first phase shown in FIG. 2, however, at least one insulating layer 6 is applied to this semiconductor material 5 in each case on the upper face and lower face thereof. This insulating layer or layers 6 can be formed, for example, from silicon nitride and/or silicon oxynitride.

Silicon nitride ($Si_3N_4$) is an amorphous semiconductor material. It has the advantage over other semiconductors that it is non-conductive and no charge carriers flow away in the event of "leaks" in the silicon nitride layer.

Another or a further insulating layer 6 could be formed of thermal oxide.

Silicon nitride could be applied in particular by means of an LPCVD process (low pressure chemical vapour deposition or chemical gas deposition) under negative pressure and, for example, at a process temperature of around 900° C., for example in a layer thickness of approximately 100 nm. Thermal oxide could, for example, be formed having a layer thickness of approximately 400 nm.

Figure 3:
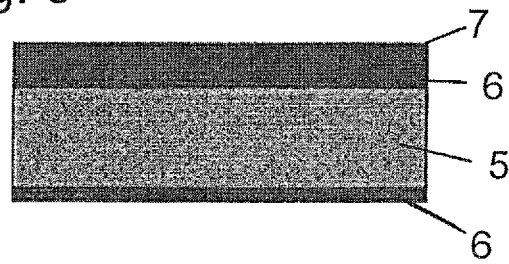

FIG. 3 shows the second phase, in which a layer of polysilicon 7 is applied to the wafer. This could in turn occur by means of an LPCVD process. The polysilicon could also be doped immediately (in-situ), preferably n-doped, preferably using phosphorus. The process temperature could be approximately 580° C., for example. The layer thickness of the polysilicon could, for example, be approximately 2 μm, but it could also preferably be greater. The electrical resistivity could be approximately $7.5 \times 10^{-6}$ ohm meters (or preferably less), for example. A heating process can subsequently be carried out under a preferably nitrogen atmosphere at approximately 1050° C., for example, and for 30 minutes, for example.

Figure 4:
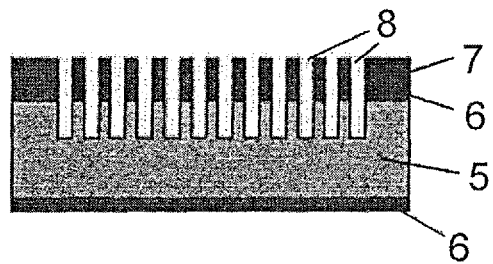

FIG. 4 shows the third phase of a possible manufacturing method according to the invention. By means of a first mask and preferably using a photoresist, lithography of the wafer is carried out, in which microchannels 8 are etched into the wafer from the upper face of the wafer, which microchannels initially only extend a little into the wafer in a substantially vertical manner. In this first etching step, the microchannels 8 could in particular be introduced (in each case, if present) through the polysilicon layer, the silicon nitride layer, the thermal oxide layer and approximately 2 to 20 μm deep into the silicon. The microchannels 8 are still closed, at the lower ends thereof, by the remaining silicon layer thickness and the lower insulation layers 6. The microchannels 8 are introduced into the wafer in the regions in which heating bodies 1 are to be formed. The etching preferably occurs as dry etching, preferably as reactive ion etching (RIE). Oxidation could optionally be performed as an etch stop and for the purpose of passivation.

Figure 5:
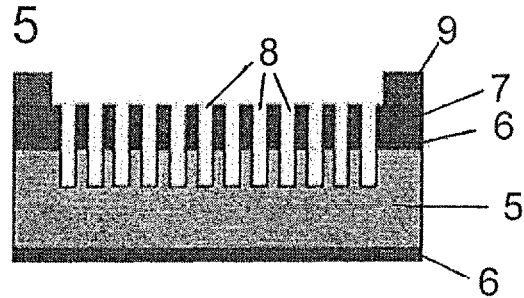

FIG. 5 shows a next optional phase in the manufacturing process, in which electrical contacts 9, for example made of aluminium, are selectively applied to the wafer using a second mask and a second lithography process, preferably by "sputtering". Further heating at approximately 450° C., for example, for 30 minutes, for example, could take place subsequently.

At this point, it should be mentioned that the phases according to FIGS. 4 and 5 could substantially also be carried out in reverse chronological order. Electrical contacts 9 could therefore first be applied to the polysilicon layer 7 before the microchannels 8 are etched into the wafer. The electrical contacts could also be applied by plating instead of sputtering, i.e. for example by chemical metal deposition. Chromium and/or gold and/or an alloy thereof can also be considered. Low-resistance, easily solderable contacts can be considered in particular. For example, electrical contacts could be applied having a layer thickness of approximately 500 nm.

Figure 6:
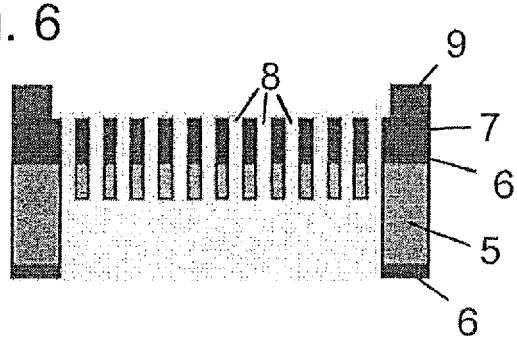

A further phase of manufacture is shown in FIG. 6. Protection could first be applied to the contacts 9. Substantially, however, the wafer is now processed from the rear face or lower face by a new lithography process being carried out from said face using a third mask, in order to remove the residual silicon 5 material, for example for each heating body 1 by means of a large central opening, and to thus open the microchannels 8 at the previously closed ends thereof for the purpose of liquid permeability. As already mentioned above, the microchannel ends could also receive a different cross section than the openings of the microchannels 8 at the upper face of the wafer. The material is again preferably removed by etching, in particular by RIE and/or DRIE. DRIE can, in this case, preferably be used for the silicon material or the other original wafer material, while RIE is preferably used for piercing an oxide layer if such a layer had previously been applied as an etch stop.

Next (not shown in the drawing), individual heating bodies 1 or groups of heating bodies can be separated from the wafer ("dicing"). The protection of the contacts 9, if previously attached, can be removed again.

In principle, the heating bodies are thus finished and functional. Liquid can be conveyed through the microchannels 8 from a reservoir, from an inlet side of the microchannels 8 to an outlet side, and can be heated by electrical resistance heating of the doped semiconductor material of the heating body 1 and evaporated to form an aerosol. The microchannels 8 can, in this case, preferably have a capillary action, but a suitable type of pump conveyance could also be considered. In the case of capillary microchannels 8, said microchannels could, in principle, be applied directly to a liquid surface of a reservoir. However, the use of non-woven materials, wicks, porous materials or the like for conveying liquid, in particular in an interface region, can also be considered. This is usually even preferable for a uniform distribution and heating of the liquid via the heating body 1. In any case, leak-tight liquid conveyance should and can be ensured.

Although the heating body produced in this manner according to the invention can be used "naked", it is of course also possible to package said heating body in a suitable manner, for example to bind the heating body using a polyimide layer, without impairing the liquid conveyance or compromising the leak tightness.

As can be seen from FIGS. 7 to 11 and in particular FIG. 9, unlike in the previous drawings, the outlet opening 68 of a heating body can advantageously also be elongate or slit-shaped, i.e. the length L of the opening 68 can preferably be greater than the width B by at least a factor of 1.5, more preferably by at least a factor of 2, even more preferably by at least a factor of 2.5. The opening 68 can also be shaped differently, for example so as to be round, square or polygonal.

The heating element 65 of a heating body, which is shown here as an example, preferably consists of an NTC material having a negative temperature coefficient. A device 72 for measuring the resistance of the heating element 65 is preferably provided in the electronic unit 19. The electronic unit 19 can advantageously control or regulate the temperature of the heating element 65 on the basis of the by means of the resistance measuring device 72, or a T-sensor (not shown) or a neighbouring heating element.

A silicon substrate which is, for example, approximately 0.3 mm to 1 mm thick, is in turn preferably used as the material for the heating body. When using 100 wafers, the opening 68 in the silicon substrate that forms the channel 62 can be formed, for example, by wet chemical etching using potassium hydroxide solution (KOH), in such a way that said opening advantageously tapers. This leads to low post-flow resistance and thus a large quantity of vapour that can be released. As already explained earlier, this wet etching can preferably be carried out from an inlet side of the heating body, while, for example, dry etching could be preferred and carried out from the outlet side.

In order to keep the chip dimensions small, however, it can also be advantageous to produce an opening having vertical walls, in which opening the cross section of the channel 62 remains constant from the inlet side 61 to the outlet side 64. This could be achieved by dry etching or KOH etching 110 wafers.

The heating element 65 preferably consists of a 0.5 μm to 10 μm thick layer made of a suitable, electrically conductive material, in particular polysilicon. The base semiconductor material and the heating element 65 can be separated from one another by a thermally and/or electrically insulating layer 74. This would correspond to layers 7, 5 and 6 in FIGS. 2 to 6.

The capillary effect can advantageously be supported by a conveyance control device and/or flow control device provided in the liquid channel 62. Said device can in particular be a pump, a valve and/or a device based on electrowetting.

The cycle duration of an evaporation cycle can preferably be in the range between 20 ms and 200 ms, so that the user perceives the vapour to be unpulsed, and a corresponding number of cycles can be completed per smoking process or per puff. Alternatively, the evaporation control could also be designed such that a single cycle of, for example, approx. 2 s duration is used as a smoking process or puff. In general, the heating voltage Uh is preferably pulsed using a pulse frequency in the range between 10 Hz and 10 kHz.

The outlet inner width, delimited by the or a heating element 65, advantageously has dimensions of between approx. 10 μm and 500 μm, in order to have a sufficiently high capillary force to prevent a liquid from leaking out.

The desired temperature for the evaporation of the liquids is generally in the range between 100° C. and 400° C.

The heating body is preferably a micro-electromechanical (MEMS) component, is preferably manufactured in clean-room technology and has a defined geometry of the opening 68 and the heating element 65.

The geometry of the heating element 65 is advantageously designed such that there is a homogeneous temperature distribution over the heating element 65. For this purpose, the local cross section of the heating element 65 can be varied such that an increased heat output is set at points of increased heat loss, in particular by locally reducing the electrical resistance.

Various advantageous embodiments of the heating element 65 are each shown in a plan view from above in FIGS. 7 to 11.

In the embodiment according to FIG. 7, the hatched heating element 65 is arranged over the slit-shaped opening 68 in the longitudinal direction such that an elongate central web 80 which is oriented in parallel with the longitudinal direction of the opening 68 is formed. The web 80 is connected on both sides to the edge of the opening 68 along the longitudinal sides of the slot 68 on the heating body by means of a plurality of lateral projections 81 which are distributed over the length of the web 80. A plurality of nozzles 79 are formed in this way, one nozzle 79 being formed in each case by the web 80, two projections 81, and part of the opening edge of the opening 68. The opening width of a nozzle 79 is in the range of approximately 10 μm to 0.2 mm. The width of the web 80 and the projections 81 depend critically on the material of the heating element 65. Said widths are advantageously in the range between approx. 5 μm and 0.1 mm.

The nozzles 79 could also be viewed individually as channels 62 and correspond to said channels, in particular as an alternative to the views in FIGS. 14 to 16. In general, another development of the heating body according to the invention could provide that a number K1 of flow channels, a number K2 of through-openings and/or a number K3 of through-holes differ from one another, and/or a single through-opening and/or a single through-hole, in particular, if necessary, as an inlet opening and/or an outlet opening, is associated with a group of flow channels which in particular has a group number G1 which is less than or equal to K1.

The flow channels, through-openings and/or through-holes can have the same or different passage cross sections. The number K1 of the flow channels, preferably microchannels, the number K2 of the through-openings and/or the number K3 of the through-holes can differ from one another. In particular, K1 can be greater than K2 and/or greater than K3. K2 can be greater than K3. A single through-opening and/or a single through-hole, the cross section of which is adapted to, in particular corresponds to or exceeds, the cross section of the group of flow channels/microchannels, can be associated with a group of flow channels/microchannels which in particular has a group number G1 of less than or equal to K1. In this way, if desired, a group of a plurality of channels having a smaller number of through-openings could preferably be optionally blocked and/or released, and a simpler manufacturing process could be achieved. This allows for a group of a plurality of channels having a smaller number of through-holes for supplying liquid, and a simpler manufacturing process. For example, a common through-opening and/or a common through-hole can be associated with a group which has a group number G1 of 3 to 10 channels. In this case, the through-opening and/or the through-hole overlaps the 3 to 10 channels.

Since the projections 81 dissipate heat, the web 80 is cooler at the connection points to the projections 81 than in the centre between two projections 81. This effect can be compensated for by a tapered portion 82 of the web 80 at the connection point to the projection 81, and/or by a widened portion 83 of the web 80 in the longitudinal direction between two projections 81; see FIG. 8. Due to the increased current density in the region of the tapered portion 82, more heat is generated there, which compensates for the increased level of heat dissipation.

A further advantageous embodiment, in which the heating element 65 is shaped as a meander, is shown in FIG. 9. As described, the increased level of heat dissipation at the connection points to the opening edge of the opening 68 can be compensated for by tapered portions 82 or widened portions 83; see FIG. 10.

A further embodiment is shown in FIG. 11. A large opening 68 in the semiconductor material is covered by a layer of heating material which forms the heating element 65. A plurality of holes 71 having a diameter in the range between approx. 10 μm and 0.5 mm is located in this layer as nozzles 79 for outletting vapour.

FIGS. 7, 11 and 13 show electrodes 84 which are connected to the heating element 65 in order to apply the heating voltage Uh to said heating element.

The heating element 65 can be in the form of a heating wire or another suitable form. The measurement of the resistance of the heating element 65 by means of the measuring device 72 is used to measure the temperature of the heating element 65 and, optionally, to control the heating element by adapting the operating current Ih or the operating voltage Uh. The temperature can be measured over the entire heating body or only over portions. Thus, when current is supplied, the local resistance and therefore the local temperature can be measured by measuring the voltage between two projections 81 (FIG. 7) or between two turns of the meander (FIG. 9).

Alternative embodiments of the heating elements 65 are shown in FIGS. 12 and 13. The shape thereof, having heating conductors 85, is based on bionic structures such as those found in the form of microfibrils, in particular in wood fibre cells or tracheae; see FIG. 12. Advantageous dimensions of the channels 86 between the heating conductors 85, i.e. the free space between adjacent heating structures 85, are in the range between 10 μm and 0.5 mm, more advantageously between 15 μm and 150 μm.

A bionic heating structure having correspondingly shaped and spaced heating elements 65 which can be connected to one another in series by conduit portions 87 is shown in FIG. 13. FIG. 13A is an enlarged, detail view of FIG. 13 in the region of a heating element 65. As can be seen in FIGS. 13 and 13A, the advantageous network-like linking of the heating elements 85, and the heating element geometry result in a dense surface structure having a large surface coverage, which enables particularly rapid and efficient evaporation of liquid.

Figure 14:
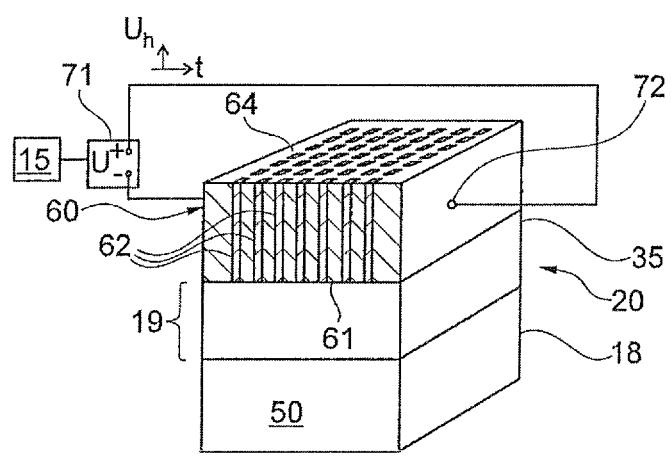
FIG. 14 is a perspective cross-sectional view of an evaporator unit according to the invention.
Figure 15:
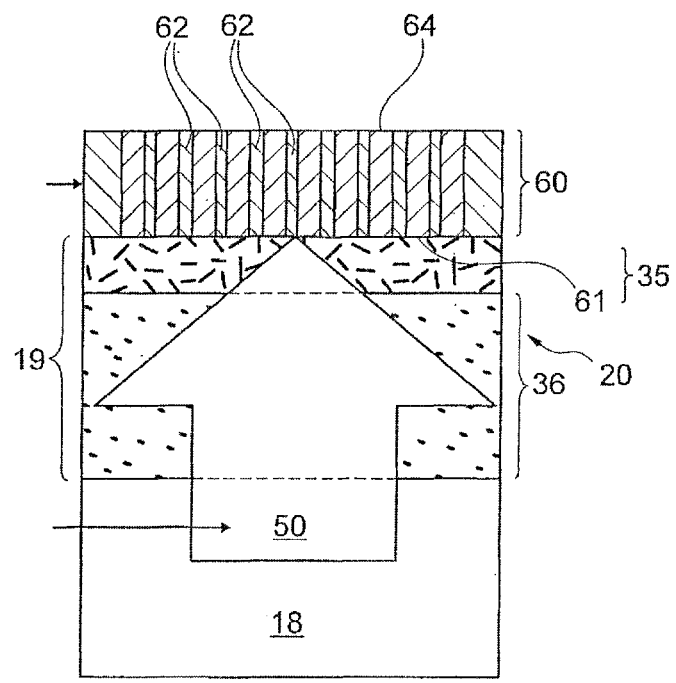
FIG. 15 is a schematic cross-sectional view of an evaporator unit according to the invention.

Other advantageous embodiments of an evaporator unit 20 according to the invention are shown in different cross sections in FIGS. 14 and 15.

The evaporator unit 20 comprises a block-shaped, preferably monolithic heating body 60, preferably made of an electrically conductive material, in particular a semiconductor material, preferably silicon. It is not necessary for the entire heating body 60 to consist of an electrically conductive material. It may be sufficient, for example, for the surface of the heating body 60 to be electrically conductive, e.g. metal-coated or preferably suitably doped. In this case, the entire surface does not have to be coated; for example, metal or preferably non-metal or non-metal laminated metal conducting tracks can be provided on a non-conductive or semi-conductive main body. It is also not absolutely necessary for the entire heating body 60 to heat up; it may be sufficient, for example, if a portion or a heating layer of the heating body 60 heats up in the region of the outlet side 64.

The heating body 60 is provided with a plurality of microchannels 62, which fluidically connect an inlet side 61 of the heating body 60 to an outlet side 64. The inlet side 61 is fluidically connected to the liquid store 18 via a wick structure 19. The wick structure 19 is used to passively convey liquid from a liquid store 50 to the heating body 60 by means of capillary forces.

The average diameter of the microchannels 62 is preferably in the range between 5 μm and 200 μm, more preferably in the range between 30 μm and 150 μm, even more preferably in the range between 50 μm and 100 μm. Due to these dimensions, a capillary action is advantageously produced, so that liquid penetrating a microchannel 62 at the inlet side 61 rises upwards through the microchannel 62 until the microchannel 62 is filled with liquid. The volume ratio of the microchannels 62 to the heating body 60, which can be referred to as the porosity of the heating body 60, is for example in the range between 10% and 50%, advantageously in the range between 15% and 40%, more advantageously in the range between 20% and 30%, and is, for example, 25%. The lengths of the edges of the surfaces of the heating body 60 that are provided with microchannels 62 are, for example, in the range between 0.5 mm and 3 mm. For example, the dimensions of the surfaces of the heating body 60 that are provided with microchannels 62 can be as follows: 0.95 mm×1.75 mm or 1.9 mm×1.75 mm or 1.9 mm×0.75 mm. The lengths of the edges of the heating body 60 can be, for example, in the range between 0.5 mm and 5 mm, preferably in the range between 0.75 mm and 4 mm, more preferably in the range between 1 mm and 3 mm. The surface of the heating body 60 (chip size) can be, for example, 1 mm×3 mm or 2 mm×3 mm. The width of the heating body 60 is preferably in the range between 1 mm and 5 mm, more preferably in the range between 2 mm and 4 mm, and is, for example, 3 mm. The height of the heating body 60 is preferably in the range between 0.05 mm and 1 mm, more preferably in the range between 0.1 mm and 0.75 mm, even more preferably in the range between 0.2 mm and 0.5 mm, and is, for example, 0.3 mm. Even smaller heating bodies can also be manufactured according to the invention and operated in a functional manner.

The number of microchannels 62 is preferably in the range between 4 and 1000. This allows the heat input from the substrate into the microchannels 62 to be optimised and ensures a high evaporation capacity and a sufficiently large vapour outlet surface.

The microchannels 62 are arranged in the form of a square, rectangular, polygonal, round, oval or differently shaped array, as can be seen in FIG. 14. The array can be in the form of a matrix having s columns and z rows, s advantageously being in the range between 2 and 50 and more advantageously in the range between 3 and 30, and/or z advantageously being in the range between 2 and 50 and more advantageously in the range between 3 and 30. This allows for an effective arrangement of microchannels 62 having a guaranteed high evaporation capacity, which is simple to produce.

The cross section of the microchannels 62 can be square, rectangular, polygonal, round, oval or otherwise shaped and/or vary in the longitudinal direction in portions, in particular can increase, decrease or remain constant.

The length of one or each microchannel 62 is preferably in the range between 100 μm and 1000 μm, more preferably in the range between 150 μm and 750 μm, even more preferably in the range between 180 μm and 400 μm, and is, for example, 300 μm. This allows for an optimum liquid absorption and portion formation in the case of sufficient heat input from the heating body 60 into the microchannels 62.

The distance between two microchannels 62 is preferably at least 1.3 times the inner diameter of a microchannel 62, the distance being in relation to the central axes of the two microchannels 62. The distance can preferably be 1.5 to 5 times, more preferably 2 to 4 times, the inner diameter of a microchannel 62. This allows for an optimum heat input from the substrate into the microchannels, and a sufficiently stable arrangement and wall thickness of the microchannels.

Due to the features described above, the heating body 60 can also be referred to as a volume heater.

The evaporator unit 20 has a heating voltage source 71, which can preferably be controlled by the control apparatus 15 and is connected to the heating body 60 by means of electrodes 72 on opposite sides of said heating body, such that an electrical voltage Uh generated by the heating voltage source 71 leads to a current flow through the heating body 60. Due to the ohmic resistance of the electrically conductive heating body 60, the current flow leads to heating of the heating body 60 and therefore to evaporation of the liquid contained in the microchannels 62. The heating body 60 thus acts as an evaporator. The vapour/aerosol generated in this manner escapes to the outlet side 64 from the microchannels 62 and is mixed with the air flow 34; see FIG. 17. More precisely, upon detection of an air stream 34 through the air channel 30, caused by the consumer puffing, the control apparatus 15 actuates the heating voltage source 71, the liquid in the microchannels 62 being driven out of the microchannels 62 in the form of vapour/aerosol by spontaneous heating.

The duration of the individual evaporation steps at different temperatures and/or during evaporation of the individual components of the individual portions of the liquid can be kept short and/or can be clocked using an actuation frequency, such that the step-by-step evaporation cannot be perceived by a consumer and a largely homogeneous, taste-consistent, repeatable precise aerosol formation can nevertheless be ensured. In particular, it is advantageous to first evaporate a low-boiling component of the liquid in a first evaporation interval at a first temperature A, and to then evaporate a high-boiling component of the liquid in a second evaporation interval at a second temperature B which exceeds the temperature A.

The heating body can be connected electronically or electrically, for example via clamp, spring or press contacts so as to have easier interchangeability and, if necessary, in order to support sealing effects to protect against leaks, and/or by means of wire bonding or soldering.

A voltage curve Uh(t) adapted to the liquid mixture used is preferably stored in the data store of the inhaler 10. This makes it possible to set the voltage curve Uh(t) so as to be adapted to the liquid used, such that the heating temperature of the heating body 60, and therefore also the temperature of the capillary microchannels 62, can be controlled over time in accordance with the known evaporation kinetics of the relevant liquid during the evaporation procedure, as a result of which optimum evaporation results can be achieved. The evaporation temperature is preferably in the range between 100° C. and 400° C., more preferably between 150° C. and 350° C., even more preferably between 190° C. and 290° C.

A porous and/or capillary, liquid-conducting wick structure 19 is arranged on the inlet side 61 of the heating body 60. The wick structure 19 contacts the inlet side 61 of the heating body 60 over the surface thereof, and covers all of the microchannels 62 on the inlet side, as can be seen in FIGS. 14 and 15. On the side opposite the heating body 60, the wick structure is fluidically connected to the liquid store. The direct connection of the liquid store 18 to the wick structure 19 shown in FIGS. 14 and 15 is only to be understood as an example. In particular, a liquid interface and/or a plurality of liquid conduits can be provided between the liquid store 18 and the wick structure 19. The liquid store 18 can therefore also be arranged at a distance from the wick structure 19. The dimensions of the liquid store 18 can be larger than those of the wick structure 19. The wick structure 19 can, for example, be inserted into an opening in a housing of the liquid store 18. A plurality of evaporator units 20 can also be associated with one liquid store 18.

The wick structure 19 consists of porous and/or capillary material which, due to capillary forces, is able to passively refill a sufficient quantity of liquid evaporated from the heating to body 60 from the liquid store 18 to the heating body 60 in order to prevent the microchannels 62 from running empty and to prevent problems resulting therefrom.

The wick structure 19 advantageously consists of a non-conductive material, in order to prevent undesired heating of the liquid in the wick structure 19 by the current flow. The wick structure 19 advantageously consists of one or more of the following materials: cotton, cellulose, acetate, glass fibre woven fabric, glass fibre ceramic, sintered ceramic, ceramic paper, aluminosilicate paper, metal foam, metal sponge, another heat-resistant, porous and/or capillary material having a suitable conveying rate, or a combination of two or more of the above-mentioned materials. In an advantageous practical embodiment, the wick structure 19 can comprise at least one ceramic fibre paper and/or one porous ceramic. The volume of the wick structure 19 is preferably in the range between 1 mm$^3$ and 10 mm$^3$, more preferably in the range between 2 mm$^3$ and 8 mm$^3$, even more preferably in the range between 3 mm$^3$ and 7 mm$^3$ and is, for example, 5 mm$^3$.

If the wick structure 19 consists of a conductive material, which is not excluded, an insulating layer made of an electrically and/or thermally insulating material, for example glass, ceramic or plastics material, is advantageously provided between the wick structure 19 and the heating body 60, which insulating layer has through-openings which extend through the insulating layer and correspond to the microchannels 62.

The size of the pores or capillaries in the material of the wick structure 19 is advantageously subject to certain requirements. The average pore/capillary size Dw of pores or capillaries of the wick structure 19 in the contact region 35, 61 with the heating body 60 is advantageously minimal, i.e. Dw=Pmin (see FIG. 5, 6), and/or advantageously smaller, preferably by at least a factor of 2, more preferably by at least a factor of 5, than the smallest distance Dp between two microchannels 62, i.e. Dw«Dp; see FIG. 4. Furthermore, the average pore/capillary size Dw of pores or capillaries of the wick structure 19 in the contact region 35, 61 with the heating body 60 is advantageously smaller, preferably by at least a factor of 2, more preferably by at least a factor of 5, than the smallest inner diameter Dpw of a microchannel 62, i.e. Dw«Dpw.

The wick structure 19 in the contact region 35, 61 with the heating body 60 is used to distribute liquid evenly, to be temperature-resistant and to form a kind of check valve by means of the relatively small pores and/or thin capillaries thereof, in order to prevent undesirable backflow of bubble-containing liquid from the heating body 60 into the wick structure 19 and/or into the liquid store 18.

In the embodiment according to FIG. 15, the wick structure 19 has two, for example planar, layers 35, 36, specifically a wick layer 35 which rests over the surface of the inlet side 61 of the heating body 60 and contacts said inlet side, which wick layer can be referred to as a contact layer, and an adjoining wick layer 36 which is fluidically connected to the liquid store 18 and can be referred to as a more remote wick layer.

The contact layer 35 has a substantially constant pore/capillary size distribution and a substantially constant average pore/capillary size Dw which is significantly smaller than the smallest distance Dp between two microchannels 62 and significantly smaller than the smallest inner diameter Dpw of a microchannel 62: Dw«Dp, Dpw.

The more remote wick layer 36 has a substantially constant pore/capillary size distribution and a substantially constant average pore/capillary size Dw' which is significantly larger than the average pore/capillary size Dw of the contact layer 35: Dw'>Dw, but is still preferably smaller than Dp and/or Dpw: Dw'<Dp, Dpw.

In an advantageous practical embodiment, the contact layer 35 can be, for example, a fibre paper layer or a ceramic paper layer and/or the layer 36 can be a porous ceramic.

The wick structure 19 can of course have more than two wick layers 35, 36, . . . . In the case of more than two wick layers 35, 36, . . . , the average pore/capillary size advantageously becomes monotonically (i.e. from wick layer to wick layer) smaller and/or remains the same, and therefore in any case does not increase, as the distance from the heating body 60 decreases.

In the embodiment according to FIG. 14, the wick structure 19 consists of only one layer, the average pore/capillary size of which becomes monotonically smaller as the distance d from the heating body 60 decreases.

In all of the embodiments, the desired pore/capillary size gradient can be optimally set, and the liquid flow to the heating body 60 can be slowed and made even.

The described reduction in the average pore/capillary size in the wick structure 19 as the distance from the heating body 60 decreases applies in the direction perpendicular to the inlet side 61 of the heating body, i.e. perpendicular to the contact surface between the heating body 60 and the wick structure 19, or parallel to the course of the microchannels 62. In contrast, within a view which is an equal distance d from the heating body 60, the average pore/capillary size in the wick structure 19 is advantageously constant, such that all microchannels 62 of the heating body 60 are evenly supplied with liquid.

The microchannels 62 are preferably arranged such that the longitudinal axis thereof is transverse to the layers 19, 35, 36 or more generally to any layer sequence. This allows for an optimum heat input from the heating body 60 into the microchannels 62.

The heating body 60 can be advantageously produced from portions of a wafer using thin-film layer technology, which wafer has a layer thickness of preferably less than or equal to 1000 μm, more preferably less than or equal to 750 μm, even more preferably less than or equal to 500 μm. Surfaces of the heating body 60 can advantageously be hydrophilic. The outlet side 64 of the heating body 60 can advantageously be microstructured or have microgrooves.

The evaporator unit 20 is set such that a quantity of liquid is added which is preferably in the range between 1 μl and 20 μl, more preferably between 2 μl and 10 μl, even more preferably between 3 μl and 5 μl, typically 4 μl per puff by the consumer. The evaporator unit 20 can preferably be set with regard to the liquid/vapour quantity per puff, i.e. per 1 s to 3 s puff duration.

In the following, the course of an evaporation procedure is explained by way of example.

In an initial state, the voltage source 71 (FIG. 16; see also energy store 14 in FIG. 17) is switched off for the heating process.

In order to evaporate liquid 50, the voltage source 14, 71 for the heating body 60 is activated. The voltage Uh is set such that the evaporation temperature in the heating body 60 and therefore in the microchannels 62 is adapted to the individual evaporation behaviour of the liquid mixture used. This prevents the danger of local overheating and, as a result, the formation of harmful substances.

Undesired differential evaporation of a liquid mixture can in particular also be counteracted, addressed or prevented according to the invention. A liquid mixture could otherwise, due to different boiling temperatures, lose components prematurely in the course of a sequence of evaporation procedures, in particular "puffs", before the reservoir of liquid is completely emptied, which could result in undesirable effects for a user during further operation, in particular for a pharmaceutically active liquid.

As soon as a quantity of liquid that corresponds to or is related to the volume of the microchannels 62 has evaporated, the heating voltage source 14, 71 is deactivated. Since the liquid properties and quantity are advantageously exactly known and the heating body 60 has a measurable temperature-dependent resistance, this point in time can be very precisely determined or controlled. The energy consumption of the evaporator unit 20 can therefore be reduced compared to that of known apparatuses, since the required evaporation energy can be introduced in a more highly dosed and therefore more precise manner.

After completion of the heating procedure, the microchannels 62 are mostly or completely emptied. The heating voltage 14, 71 is then kept switched off until the microchannels 62 are refilled by conveying liquid through the wick structure 19. As soon as this happens, the next heating cycle can be started by switching on the heating voltage 14, 71.

The actuation frequency of the heating body 60 that is generated by the heating voltage source 14, 71 is generally advantageously in the range from 1 Hz to 50 kHz, preferably in the range from 30 Hz to 30 kHz, and even more advantageously in the range from 100 Hz to 25 kHz.

The frequency and the duty cycle of the heating voltage Uh for the heating body 60 are advantageously adapted to the natural oscillation or natural frequency of the bubble oscillations during saturated boiling. The period duration 1/f of the heating voltage can therefore advantageously be in the range between 5 ms and 50 ms, more advantageously between 10 ms and 40 ms, even more advantageously between 15 ms and 30 ms and, for example, 20 ms. Depending on the composition of the evaporated liquid, frequencies other than those stated can be optimally adapted to the natural oscillation or natural frequency of the bubble oscillations.

Furthermore, it has been shown that the maximum heating current generated by the heating voltage Uh is preferably no more than 7 A, more preferably no more than 6.5 A, even more preferably no more than 6 A and should optimally be in the range between 4 A and 6 A in order to ensure concentrated vapour while preventing overheating.

The conveying rate of the wick structure 19 is in turn optimally adapted to the evaporation rate of the heating body 60, such that sufficient liquid can be refilled at any time and the region upstream of the heating body 60 is prevented from running dry.

In addition, it should be noted at this point, as a precaution, that the evaporator system can also be controlled by controlling the current, instead of by controlling the voltage. In the preceding explanations, reference can therefore also be made to a current Ih, instead of to the voltage Uh.

The evaporator unit 20 is preferably manufactured on the basis of MEMS technology, in particular from silicon, and is therefore advantageously a micro-electromechanical system.

According to the above, a layered structure is advantageously proposed that consists of a Si-based heating body 60 which is advantageously planar at least on the inlet side 61, and of one or more capillary structures 19 which are underneath said heating body and advantageously have different pore sizes. The wick structure 19 arranged directly on the inlet side 61 of the heating body 60 prevents the formation of bubbles on the inlet side 61 of the heating body 60, as gas bubbles inhibit a further conveying effect and, at the same time, lead to (local) overheating of the heating body 60 due to a lack of cooling by liquid flowing in. In the case of the method according to the invention, manufacturing or providing the heating body together or in conjunction with the wick structure thereof could also be considered.

Figure 16:
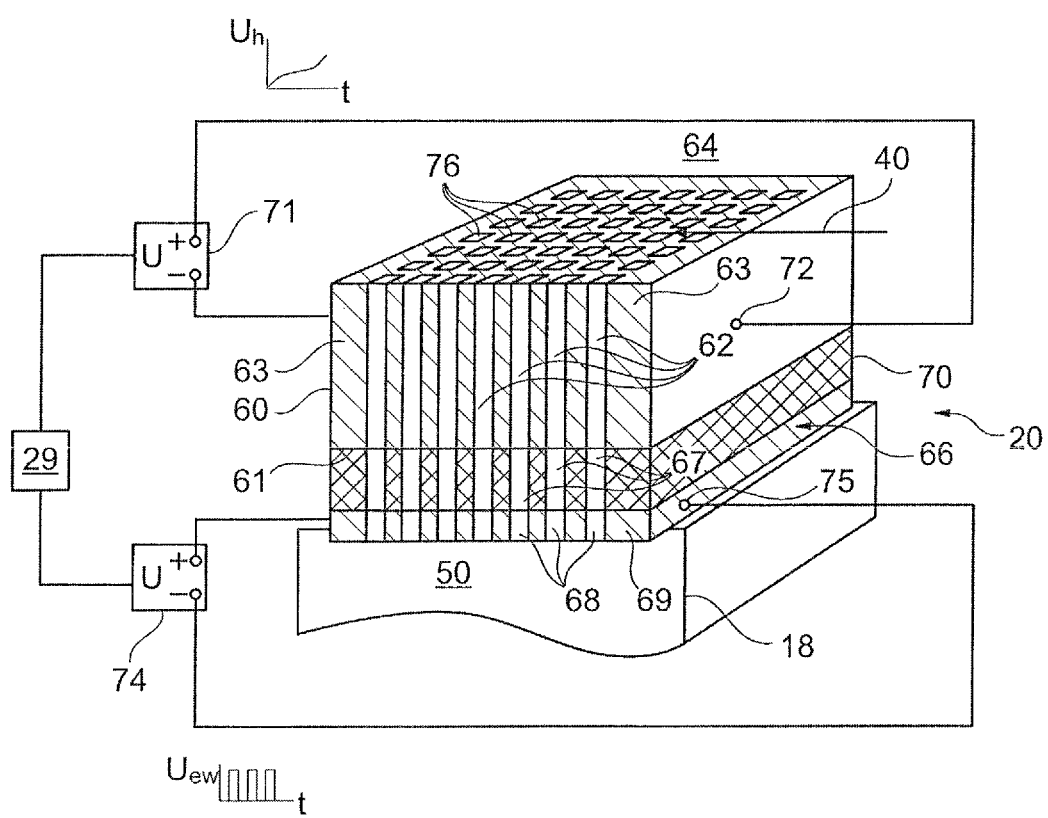
FIG. 16 is a perspective sectional view of an evaporator unit.

A further advantageous embodiment of an evaporator unit 20 according to the invention is shown in FIG. 16. The evaporator unit 20 comprises a heating body 60 having a block-shaped semiconductor substrate 63, preferably silicon. The substrate 63 is provided with a plurality of microchannels 62, which fluidically connect an inlet side 61 of the substrate 63 to an outlet side 64. The inlet side 61 is fluidically connected to the liquid store 18. This is explained in more detail below.

A flow control device 66 which controls the flow of liquid through the microchannels 62 is provided on the inlet side 61 of the substrate 60. In an advantageous embodiment, the flow control device 66 is a flow control layer 69 which has through-holes 68 extending through the flow control layer 69.

An electrical field can particularly advantageously be applied to the liquid in the flow control layer 66 in order to influence the contact angle between the liquid and the inner wall of a through-hole 68, the effect of electrowetting preferably being used. For this purpose, the evaporator unit 20 has an EW (electrowetting) voltage source 74, which can preferably be controlled by a control unit 29, and is connected to the flow control layer 69 by means of electrodes 75 on opposite sides of said control layer, such that an electrical voltage Uew generated by the EW voltage source 74 leads to a movement of the charge carriers in the liquid in the through-holes 68. In this way, the contact angle between the liquid and the inner wall of a through-hole 68 can be changed between hydrophilic (application of a suitable voltage) and hydrophobic (no voltage). If the contact angle in the through-holes 68 is set so as to be hydrophilic, the liquid is conveyed from the liquid store 18 into the through-holes 68 in a capillary manner, and, due to the capillary conveying effect, can rise into the through-openings 67 and further into the microchannels 62. If the contact angle in the through-holes 68 is set so as to be hydrophobic, the liquid is blocked from rising from the liquid store 18, through the through-holes 68, into the through-openings 67 and into the microchannels 62. Since there is no capillary conveying effect, the liquid remains in the liquid store 18. The function of the flow control layer 69 is therefore to allow switching between free passage of liquid through the through-holes 68 and blocking the passage of liquid through the through-holes 68. The flow control layer 69 can therefore also be referred to as a switching layer. According to the above, the flow control layer 69 is used to control the filling process of the microchannels 62 in the evaporation body 60.

The flow control layer 69 can also advantageously or additionally be designed as an EWOD (electro wetting on dielectrics) layer, the surface of the inner wall of the through-holes 68 being coated with a suitable dielectric. Such a dielectric can advantageously be designed as a self-assembled monolayer (SAM), by means of which the contact angle between the liquid and the inner wall of a through-hole 68 can be further or additionally influenced.

An insulating layer 70 which is made of an insulating material, for example glass or ceramic, and has through-openings 67 through the insulating layer 70 is advantageously provided between the flow control layer 69 and the substrate 63. The insulating layer 70 is used to thermally insulate the evaporation body 60 from the liquid store 18, in particular in order to prevent an undesired high level of heating and/or vapour formation of the liquid in the liquid store 18 during the evaporation. The insulating layer 70 can also be used to electrically insulate the substrate 63 from the flow control layer 69, as a result of which the evaporation and/or heating can be decoupled from the flow control. The through-openings 67 preferably correspond to the microchannels 62 and/or the through-holes 68, such that continuous microchannels are created from the liquid store 18 to the outlet openings 76 on the outlet side 64 of the substrate 63.

The microchannels 62, through-openings 67 and/or through-holes 68 are preferably arranged such that the longitudinal axis thereof is transverse to the layers 69, 70. In general, if a layer sequence is formed by the substrate 63 and the flow control layer 69 and/or the insulating layer 70 and/or at least one other layer, the microchannels 62 are advantageously arranged such that the longitudinal axes thereof are transverse to the layer sequence. In this way, an optimum heat input from the substrate 63 into the microchannels 62 can be achieved, and the microchannels 62 can largely be kept free of sealing problems. Preferably and particularly advantageously, all layers 63, 69, 70, etc. can be manufactured or formed using the method according to the invention, preferably in at least one region of a wafer.

Figure 17:
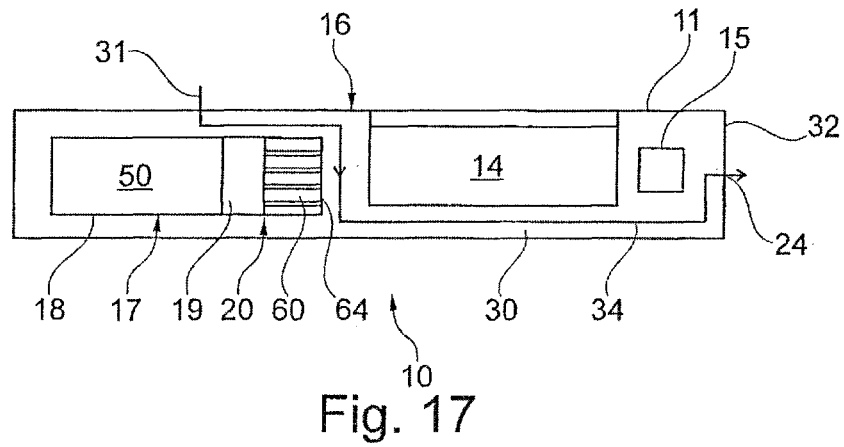
FIG. 17 schematically shows a simple embodiment of an electronic cigarette product.

The inhaler 10, in this case an electronic cigarette product, shown in FIG. 17 comprises a housing 11 in which an air channel 30 is provided between at least one air inlet opening 31 and one air outlet opening 24 at a mouth end 32 of the cigarette product 10. The mouth end 32 of the cigarette product 10 is the end on which the consumer puffs for the purpose of inhalation and thereby applies a negative pressure to the cigarette product 10 and generates an air flow 34 in the air channel 30.

The cigarette product 10 advantageously consists of a base part 16 and a consumption unit 17 which comprises the evaporator unit 20 and the liquid store 18 and is in particular in the form of an exchangeable cartridge. The air sucked in through the inlet opening 31 is conducted in the air channel 30 to or along at least one evaporator unit 20. The evaporator unit 20 is fluidically connected or can be fluidically connected by means of a wick structure 19, inter alia, to at least one liquid store 18 in which at least one liquid 50 is stored. The evaporator unit 20 evaporates liquid 50 by means of a heating body 60, which liquid is supplied to said evaporator unit from the liquid store 18, and adds the evaporated liquid into the air stream 34 as aerosol/vapour 22 at an outlet side 64. An advantageous volume of the liquid store 18 is in the range between 0.1 ml and 5 ml, preferably between 0.5 ml and 3 ml, more preferably between 0.7 ml and 2 ml or 1.5 ml.

The electronic cigarette 10 also comprises an electrical energy store 14 as a voltage source, and an electronic control apparatus 15. The energy store 14 is usually arranged in the base part 16 and can be, in particular, a disposable electrochemical battery or a rechargeable electrochemical battery, for example a lithium-ion battery. The electronic control apparatus 15 comprises at least one digital data processing device, in particular a microprocessor and/or a microcontroller, in the base part 16 and/or in the consumption unit 17.

A sensor, such as a pressure sensor or a pressure switch or flow switch, is advantageously arranged in the housing 11, the control apparatus 15 being able detect, on the basis of a sensor signal output by the sensor, that a consumer is puffing on the mouth end 32 of the cigarette product 10 in order to inhale. In this case, the control apparatus 15 actuates the evaporator unit 20, in order to add liquid 50 from the liquid store 18 into the air stream 34 as aerosol/vapour.

The liquid 50 to be dosed which is stored in the liquid store 18 is, for example, a mixture of 1,2-propylene glycol, glycerol, water, at least one flavour and/or at least one active substance, in particular nicotine.

The consumption unit or cartridge 17 advantageously comprises a non-volatile data store for storing information or parameters relating to the consumption unit or cartridge 17. The data store can be part of the electronic control apparatus 15. The data store is advantageously used to store information regarding the composition of the liquid stored in the liquid store 18, information regarding the process profile, in particular power/temperature control; data for condition monitoring or system testing, for example leak testing; data regarding copy protection and counterfeit protection, an ID for unique identification of the consumption unit or cartridge 17, serial number, date of manufacture and/or expiry date, and/or number of puffs (number of inhalation puffs by the consumer) or the period of use. The data store is advantageously connected or can be connected to the control device 15 by means of contacts and/or wires.

User-related data, in particular relating to smoking behaviour, could also be stored in the inhaler 10 and/or in an external store which can be connected, at least temporarily, to the inhaler for communication therewith in a manner which is suitable and known per se, and said data could preferably also be used to control or regulate the inhaler.

EMBODIMENTS

Embodiment 1. Method for manufacturing an electrically operable, in particular planar heating body for an inhaler, in particular for an electronic cigarette product, preferably for evaporating liquid, characterised in that a preferably metal-free semiconductor material is provided so as to be substantially planar, and a plurality of channels are incorporated into the semiconductor material substantially in the direction of the surface normal of the planar semiconductor material, such that a fluid can pass through the semiconductor material in the channels.

Embodiment 2. Method according to embodiment 1, characterised in that a silicon is substantially used as the semiconductor material, preferably a polysilicon.

Embodiment 3. Method according to either embodiment 1 or embodiment 2, characterised in that the electrical conductivity of the semiconductor material is improved at least in regions by doping.

Embodiment 4. Method according to embodiment 3, characterised in that the semiconductor material is n-doped, preferably using phosphorus.

Embodiment 5. Method according to one or more of the preceding embodiments, characterised in that, at least in regions, at least one coating is applied to the semiconductor material on at least one face of the semiconductor material.

Embodiment 6. Method according to embodiment 5, characterised in that one coating is metal.

Embodiment 7. Method according to one or more of the preceding embodiments, preferably according to embodiment 6, characterised in that the semiconductor material is provided with electrical contacts, preferably using a metal coating.

Embodiment 8. Method according to one or more of the preceding embodiments, characterised in that the semiconductor material is oxidised at least in regions.

Embodiment 9. Method according to one or more of the preceding embodiments, characterised in that the channels are formed in the semiconductor material by, preferably dry, etching.

Embodiment 10. Method according to embodiment 9, characterised in that reactive ion etching (RIE=reactive ion etching) is substantially used.

Embodiment 11. Method according to one or more of the preceding embodiments, preferably according to either embodiment 9 or embodiment 10, characterised in that the channels are fluidically accessible from both sides of the semiconductor material.

Embodiment 12. Method according to one or more of the preceding embodiments, characterised in that a plurality of heating elements are formed on a wafer, and individual heating bodies or groups of heating bodies are preferably then removed from the wafer, preferably as what are referred to as dies.

Embodiment 13. Method according to embodiments 9, characterised in that the heating body or the heating bodies are further substantially used as a bare chip.

Embodiment 14. Heating element, in particular a heating body, for an inhaler, preferably for an electronic cigarette product, characterised in that said heating element is manufactured using the method according to one or more of the preceding embodiments.

Embodiment 15. Wafer made of a semiconductor material, characterised in that it has a plurality of elements which are suitable as heating elements and are manufactured or prepared using the method according to one or more of embodiments 1 to 13, preferably according to embodiment 12.

The invention claimed is:

1. A method for manufacturing an electrically operable, planar heating body for an inhaler, comprising:
    providing a substantially planar metal-free semiconductor material;
    forming a plurality of channels into the substantially planar semiconductor material, wherein the plurality of channels are substantially in a direction of a surface normal of the substantially planar metal-free semiconductor material, wherein a fluid can pass through the substantially planar semiconductor material in the plurality of channels,
    applying, at least in regions, at least one coating to the substantially planar semiconductor material on at least one face of the substantially planar semiconductor material, and wherein the at least one coating is a metal coating so as to form heating elements, and wherein the metal coating is annular in portions of the channels or in the walls of the channels.

2. The method according to claim 1, wherein the substantially planar semiconductor material is silicon.

3. The method according to claim 1, wherein an electrical conductivity of the substantially planar semiconductor material is improved at least in regions by doping.

4. The method according to claim 3, wherein the substantially planar semiconductor material is n-doped.

5. The method according to claim 1, further comprising:
    providing the substantially planar semiconductor material with electrical contacts using the at least one metal coating.

6. The method according to claim 1, further comprising:
    oxidizing the substantially planar semiconductor material at least in regions of the metal-free semiconductor material.

7. The method according to claim 1, further comprising:
    forming the plurality of channels in the semiconductor material by etching.

8. The method according to claim 7, wherein reactive ion etching is used in forming the plurality of channels.

9. The method according to claim 7, wherein the plurality of channels are fluidically accessible from both sides of the substantially planar semiconductor material.

10. The method according to claim 1, further comprising:
    forming a plurality of heating bodies on a wafer; and
    removing individual heating bodies or groups of heating bodies from the wafer.

11. The method according to claim 10, wherein the individual heating bodies or the groups of heating bodies are further used as a bare chip.

12. The method according to claim 1, wherein the heating body is for evaporating liquid in an electronic cigarette product.

13. A heating body for an inhaler, wherein the heating body is manufactured using the method according to claim 1.

14. A wafer made of a semiconductor material, comprising a plurality of elements which are suitable as heating bodies and are manufactured using the method according to claim 1.

* * * * *